United States Patent
Kiser

[11] Patent Number: 5,856,769
[45] Date of Patent: Jan. 5, 1999

[54] CONTINUOUSLY ADJUSTABLE RESONATOR

[75] Inventor: Joseph H. Kiser, Aurora, Colo.

[73] Assignee: Vari-L Company, Inc., Denver, Colo.

[21] Appl. No.: 94,124

[22] Filed: Jun. 9, 1998

Related U.S. Application Data

[60] Provisional application No. 60/049,192 Jun. 11, 1997.
[51] Int. Cl.[6] .................................. H03H 7/00; H03J 3/22
[52] U.S. Cl. .............................. 333/174; 334/69; 361/292
[58] Field of Search .................................... 333/174, 175, 333/219, 235; 334/41, 44, 45, 46, 65, 66, 69, 78, 82; 361/278, 279, 292, 298.5, 299.4

[56] References Cited

U.S. PATENT DOCUMENTS

| | | | |
|---|---|---|---|
| 3,260,973 | 7/1966 | Bisnett et al. | 334/69 |
| 3,268,784 | 8/1966 | Harwood | 361/292 |
| 3,651,409 | 3/1972 | George et al. | 334/65 |
| 3,662,235 | 5/1972 | Napolin | 361/279 |
| 3,818,390 | 6/1974 | Gikow et al. | 334/69 |

OTHER PUBLICATIONS

Snyder, "A Single Circuit Receiver, With Special Features", Wireless Age, pp. 64, 65, Sep. 1923.

Primary Examiner—Seungsook Ham
Attorney, Agent, or Firm—Ancel W. Lewis, Jr.

[57] ABSTRACT

A resonator for a high frequency electric oscillator is disclosed. The resonator is and integrated capacitor and inductor. The capacitance and inductance of the resonator are continuously and simultaneously adjustable. The resonator includes a coaxial portion and a conductor portion. The coaxial portion has an inner dielectric with a longitudinal aperture and an outer conductive sheath or outer conductor. The conductor portion has a straight section slidable in the aperture and a V shaped bent or oblique section.

8 Claims, 2 Drawing Sheets

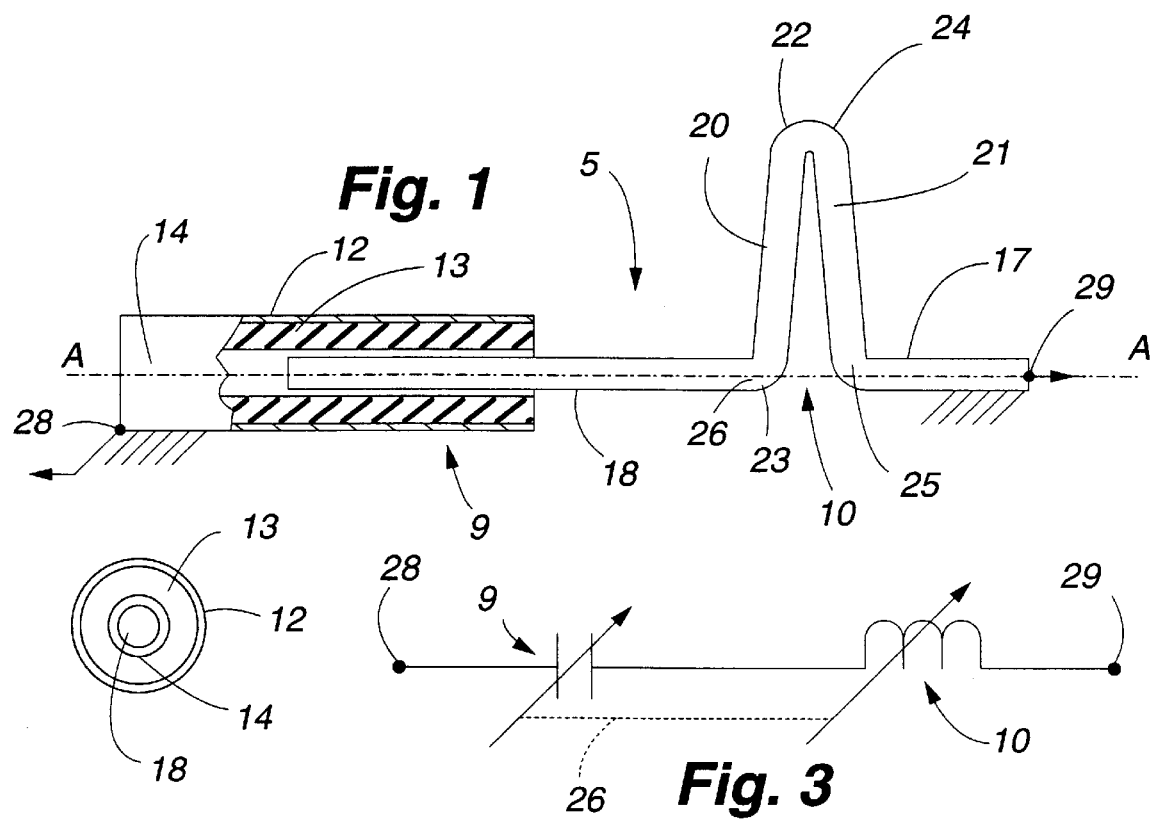
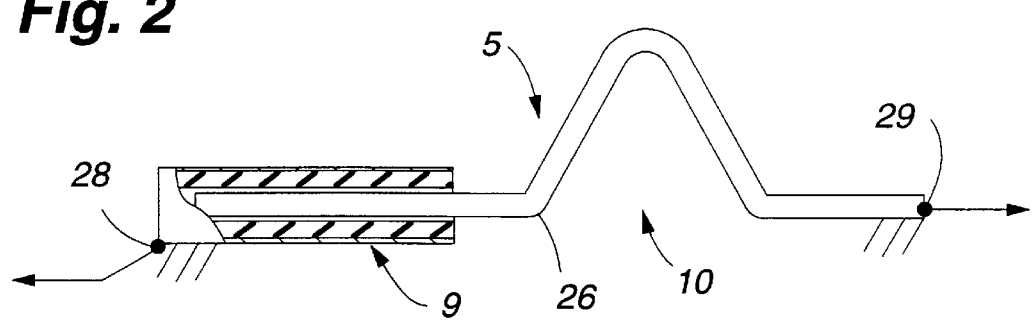
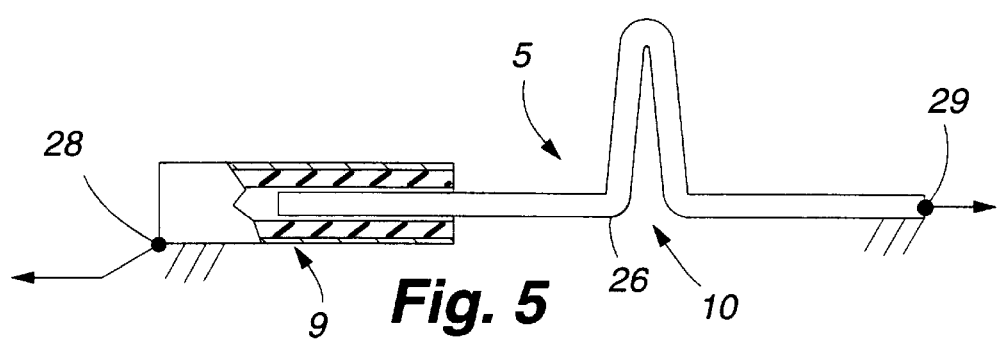

CONTINUOUSLY ADJUSTABLE RESONATOR

This application is based upon a provisional application Ser. No. 60/049,192 filed on Jun. 11, 1997.

TECHNICAL FIELD

This invention relates to electric oscillators and more particularly to an adjustable resonator for an electric oscillator operable over a wide range at high frequencies for use in Satellite Communication Bands (SATCOM) typically but not limited to 4.0–6.5 GHz.

BACKGROUND ART

In high frequency oscillators stray capacitances and lead inductances become very important in determining the oscillation frequency, output power, feedback fraction and other ac quantities. High frequency oscillators heretofore provided have a variable capacitor or a variable inductor in the tank circuit. These oscillators are assembled and then the variable capacitor or inductor is adjusted for the desired performance. Prior known adjustable or trimmable devices often have stray capacitances and inductances larger than the capacitances and inductances of the main tank circuit components, thereby limiting the maximum useful resonant frequency of the oscillator.

DISCLOSURE OF THE INVENTION

A resonator or tank circuit for an electric oscillator is disclosed with a capacitor and an inductor that are continuously and simultaneously adjustable. The capacitor is of a coaxial type having a cylindrical hollow outer conductor, a hollow coaxial dielectric portion inside the outer conductor and an inner conductor extending through and slidable inside the dielectric portion. The outer conductor is stationary or fixed. The inductor has two legs each connected at one end to form a V shape. One of the inductor legs is connected at an end opposite the connection to the capacitor inner conductor while an end opposite the connection of the other leg is fixed relative to the capacitor outer conductor. The position of the inner conductor determines the capacitance and the amount of divergence of the inductor legs determines the inductance. Movement of the inner conductor simultaneously or in tandem varies the inductance and the capacitance of the resonator so that both increase together and both decrease together.

BRIEF DESCRIPTION OF THE DRAWINGS

Details of this invention are described in connection with the accompanying drawings that bear similar reference numerals in which:

FIG. 1 is a side elevation view of a resonator embodying features of the present invention.

FIG. 2 is an end elevation view of the resonator of FIG. 1.

FIG. 3 is a schematic electric circuit diagram of the resonator of FIG. 1.

FIG. 4 is a side elevation view of the resonator of FIG. 1 adjusted near the position of maximum capacitance and inductance.

FIG. 5 is a side elevation view of the resonator of FIG. 1 adjusted near the position of minimum capacitance and inductance.

DETAILED DESCRIPTION OF THE INVENTION

Figure 6:
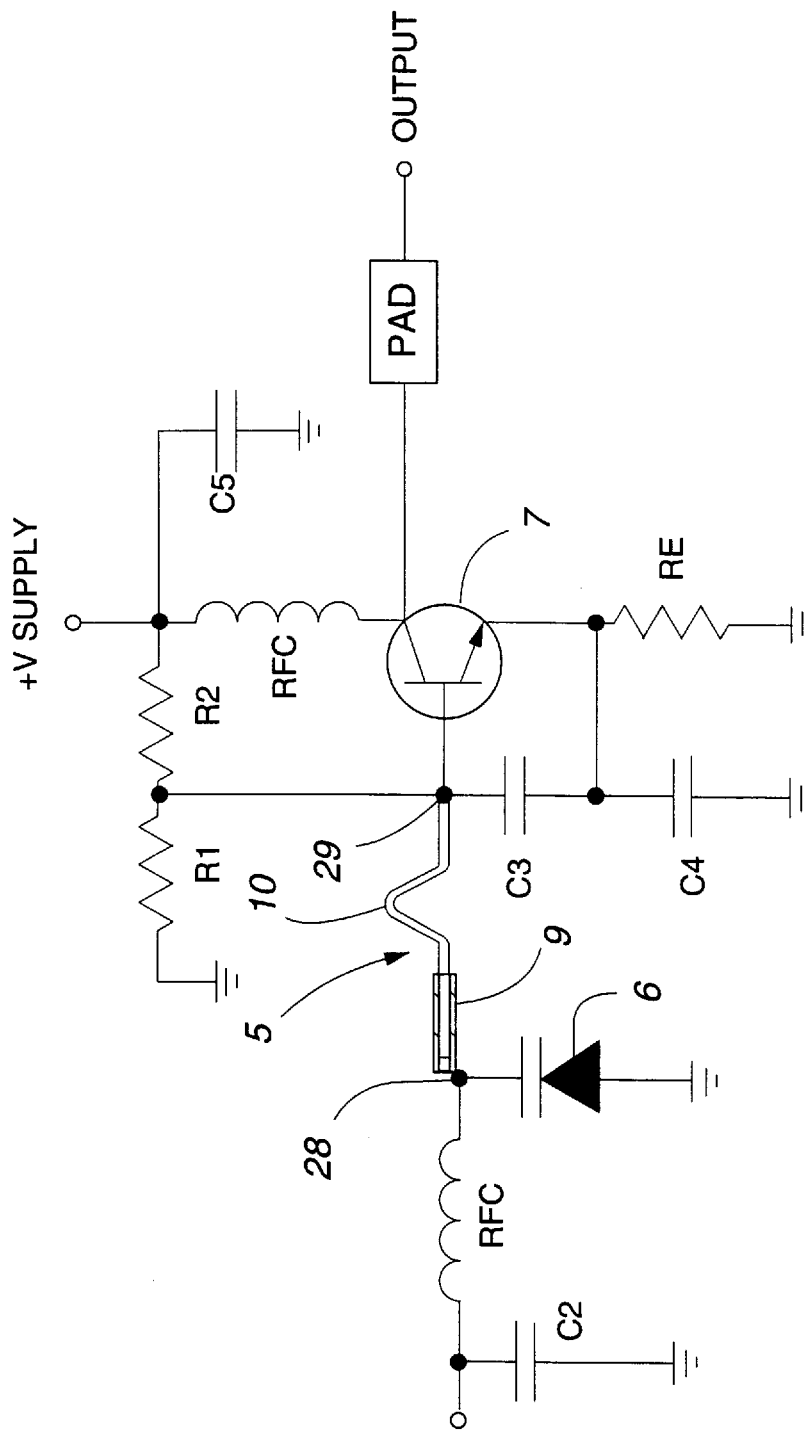
FIG. 6 is a schematic diagram of an electric oscillator incorporating the resonator of FIG. 1.

Referring now to FIGS. 1 and 2, there is shown a continuously adjustable resonator or tank circuit for an electric oscillator of this invention with a variable capacitor 9 and a variable inductor 10 connected to the capacitor 9 in a series L-C circuit.

The capacitor 9 shown is of the coaxial type having a sheath or cylindrical, hollow outer conductor 12, a cylindrical inner conductor 18 and a cylindrical, hollow dielectric portion 13 between outer conductor 12 and inner conductor 18. The outer conductor 12 and the dielectric portion 13 are attached and in coaxial alignment along a reference axis designated A so that the outer conductor 12 surrounds and is concentric or coaxial with the dielectric portion 13. The hollow interior of dielectric portion 13 forms an elongated hole or aperture 14.

The inner conductor 18 is a straight section of conductor approximately equal in length to the outer conductor 12 and the dielectric portion 13, and extends through and is in coaxial alignment along axis A with aperture 14. Inner conductor 18 and outer conductor 12 form the plates of the capacitor 9 with dielectric portion 13 being the capacitor dielectric. Inner conductor 18 is slidable longitudinally in the aperture 14 forming a capacitor adjustment means. When inner conductor 18 extends through the entire length of aperture 14 the overlap between inner conductor 18 and outer conductor 12 is at a maximum and therefore the capacitance is at a maximum. As the overlap is decreased by sliding inner conductor 18 out of aperture 14 the capacitance decreases so that the position of the inner conductor 18 determines the capacitance C.

The inductor 10 shown is of the simple loop type and is in the form of an oblique section having a first leg 20 and a second leg 21 arranged in an inverted V shape as shown. The inductor 10 may be likened to a hairpin. First leg 20 is a substantially straight section of conductor having a first end 22 and second end 23. Second leg 21 is a substantially straight section of conductor having a first end 24 and second end 25. First end 22 of first leg 20 is coupled or connected to first end 24 of second leg 21 at an acute angle such that first leg 20 and second leg 21 diverge to form the inverted V shape. The inductance of inductor 10 increases when second end 23 of first leg 20 moves away from second end 25 of second leg 21, widening the V of legs 20 and 21 and decreases when second end 23 of first leg 20 moves toward from second end 25 of second leg 21, narrowing the V of legs 20 and 21. Second end 23 of first leg 20 serves as an inductor adjustment means.

The inner conductor 18 couples at connection 26 to the second end 23 of first leg 20 such that first leg 20 and second leg 21 extend oblique to axis A with second end 23 of first leg 20 and second end 25 of second leg 21 on axis A, coupling capacitor 9 to inductor 10. Preferably inner conductor 18, first leg 20 and second leg 21 are formed from a single piece of conductor or wire with a circular cross-section. A stationary or fixed end 17 connected to second end 25 of second leg 21 may be provided for attachment of second end 25 of second leg 21 to an oscillator board. The resonator is mounted to an oscillator board with coaxial portion 11 and second end 25 of second leg 21 rigidly attached to the oscillator board, and therefore stationary or fixed relative to each other.

FIG. 4 shows the resonator adjusted near the position of maximum capacitance of capacitor 9 and maximum inductance of inductor 10. As inner conductor 18 moves out of aperture 14 the inverted V between legs 20 and 21 simultaneously narrows, simultaneously decreasing the capacitance of capacitor 9 and decreasing the inductance of inductor 10. Connection 26 provides means for simultaneously and correspondingly adjusting capacitor 9 and inductor 10. FIG. 5 shows the resonator adjusted near the minimum capacitance of capacitor 9 and the minimum inductance of inductor 10. A dashed line is shown linking the arrows in FIG. 3 to represent the tandem operation.

Both capacitance and inductance are continuously and simultaneously variable within a desired range by applying a force to the connection 26 and changing the position of the inner conductor 18 relative to outer conductor 12. The resonant frequency of the resonator is inversely proportional to the square root of the product the capacitance and inductance. When the connection 26 is moved in a first direction, away from outer conductor 12, the capacitance and inductance go down in tandem and the resonant frequency goes up. When the connection 26 is moved in an opposite second direction, toward outer conductor 12, the capacitance and the inductance correspondingly go up and the frequency goes down.

FIG. 6 shows the resonator 5 in a circuit for a voltage controlled oscillator. Outer conductor 12 serves as a first terminal 28 and fixed end 17 serves as a second terminal 29 for resonator 5. The first terminal 28 is coupled to a varactor 6 and the second terminal 29 is coupled to an amplifier 7 in the voltage controlled oscillator circuit. After assembly into the circuit the resonator is adjusted and the straight portion 18 is fixed relative to the coaxial portion 11, preferably by a drop of staking epoxy.

The simultaneous adjustment of the capacitance and inductance greatly increases the adjustment frequency range of the resonator. Since the capacitor, the inductor and the adjustment means are integrated into a single unit instead of being discrete parts the overall circuit strays are reduced and the resonator can operate at much higher frequencies. The above described resonator has been found to operate in a frequency range of about 4.0 to 6.5 GHz.

Although the present invention has been described with a certain degree of particularity, it is understood that the present disclosure has been made by way of example and that changes in details of structure may be made without departing from the spirit thereof.

What is claimed is:

1. A resonator for an electric oscillator comprising:

a stationary outer member having an inner dielectric portion with a longitudinal aperture and an outer conductor surrounding said-dielectric portion, and an inner member having a movable inner conductor and an oblique section, said inner conductor extending into said aperture, said inner conductor, said dielectric portion and said outer conductor forming a capacitor, said oblique section forming an inductor, said capacitor and inductor being simultaneously adjustable by moving said inner conductor in said aperture relative to said outer member.

2. The resonator as set forth in claim 1 wherein said oblique section has a V shape with a first leg connected to and extending transverse said inner conductor and an opposed second leg connected to said first leg and having a stationary end.

3. The resonator as set forth in claim 2 wherein said stationary end is a fixed distance from said outer member and movement of said inner conductor toward said stationary end simultaneously reduces overlap between said inner conductor and said outer conductor, and narrows said V shape of said oblique section, thereby simultaneously adjusting the capacitance of said capacitor and the inductance of said inductor.

4. A resonator for an electric oscillator comprising:

a variable capacitor with a capacitor adjustment means, a variable inductor having a first leg with a first end and a second end opposite said first end and a second leg with a first end and a second end opposite said first end, said first end of said first leg being coupled to said first end of said second leg such that said first leg and said second leg diverge to form a V shape, said second end of said second leg being fixed and said second end of said first leg being movable toward and away from said second end of said second leg to vary the inductance of said inductor, said inductor being electrically connected in series to said capacitor, and means for simultaneously adjusting the capacitance of said capacitor and the inductance of said inductor.

5. The resonator as set for in claim 4 wherein said capacitor includes a hollow cylindrical outer conductor, a cylindrical dielectric portion with an aperture therethrough, and an inner conductor, said dielectric portion being coaxial with and rigidly attached inside said outer conductor, said inner conductor being slidable inside said aperture, said capacitor being adjusted by moving said inner conductor in said aperture relative to said outer conductor.

6. The resonator as set for in claim 5 wherein said means for simultaneously adjusting includes a mechanical connection of said said second end of said first leg and said inner conductor, said mechanical connection moving in a first direction decreasing in tandem the capacitance of said capacitor and the inductance of said inductor, said mechanical connection moving in a second direction increasing in tandem the capacitance of said capacitor and the inductance of said inductor.

7. The resonator as set forth in claim 1 that operates in the frequency range of about 4.0 to 6.5 GHz.

8. A resonator for an electric oscillator comprising:

a variable capacitor including a hollow cylindrical outer conductor, a cylindrical dielectric portion with an aperture therethrough, and an inner conductor, said dielectric portion being coaxial with and rigidly attached inside said outer conductor, said inner conductor being slidable inside said aperture, said capacitor being adjusted by moving said inner conductor in said aperture relative to said outer conductor so that said inner conductor is a capacitor adjustment means, a variable inductor electrically connected in series to said capacitor, said inductor including an oblique section having a first leg and a second leg arranged in a V shape, said second leg being fixed and said first leg being movable away from and toward said second leg to change the width of said V shape, said inductor being adjusted by changing the width of said V shape so that said first leg is an inductor adjustment means, and means for simultaneously adjusting the capacitance of said capacitor and the inductance of said inductor, said means for simultaneously adjusting including a mechanical connection of said inner conductor and said first leg, said mechanical connection moving in a first direction decreasing in tandem the capacitance of said capacitor and the inductance of said inductor, said mechanical connection moving in a second direction increasing in tandem the capacitance of said capacitor and the inductance of said inductor.

* * * * *